United States Patent [19]
Dekker

[11] Patent Number: 5,987,312
[45] Date of Patent: Nov. 16, 1999

[54] OFFSET-COMPENSATED LINEAR RF DETECTOR HAVING A DETECTOR PART AND A LINEARIZER PART

[75] Inventor: André P. Dekker, Oulu, Finland

[73] Assignee: Nokia Telecommunications Oy, Espoo, Finland

[21] Appl. No.: 08/750,324

[22] PCT Filed: Apr. 2, 1996

[86] PCT No.: PCT/FI96/00179

§ 371 Date: Feb. 13, 1997

§ 102(e) Date: Feb. 13, 1997

[87] PCT Pub. No.: WO96/31947

PCT Pub. Date: Oct. 10, 1996

[30] Foreign Application Priority Data

Apr. 5, 1995 [FI] Finland .................................. 951623

[51] Int. Cl.[6] .................................................. H04Q 7/20
[52] U.S. Cl. ...................... 455/115; 455/126; 455/226.1
[58] Field of Search ................... 455/115, 126, 455/127, 226.1, 226.2; 330/260, 259, 291

[56] References Cited

U.S. PATENT DOCUMENTS

| | | |
|---|---|---|
| 3,758,865 | 9/1973 | McKibben ............................. 325/416 |
| 4,068,187 | 1/1978 | Amada et al. ......................... 330/268 |
| 4,460,873 | 7/1984 | Hester . | 
| 4,502,015 | 2/1985 | Nicholas ................................ 455/337 |
| 4,937,515 | 6/1990 | Yoshino ................................. 330/257 |
| 5,097,223 | 3/1992 | Alexander . |
| 5,132,637 | 7/1992 | Swanson . |
| 5,864,586 | 12/1995 | Kato ...................................... 455/126 |

FOREIGN PATENT DOCUMENTS

| | | |
|---|---|---|
| 367 707 | 5/1990 | European Pat. Off. . |
| 638 995 | 2/1995 | European Pat. Off. . |

*Primary Examiner*—Edward F. Urban
*Assistant Examiner*—Tilahun Gesesse
*Attorney, Agent, or Firm*—Pillsbury Madison & Sutro LLP

[57] ABSTRACT

A base station receiver and a reception method in a CDMA cellular radio system includes, in each cell, at least one base station communicating with a plurality of mobile stations situated within its area. The base stations measure the direction angle of a signal arriving from each mobile station with respect to the base station, and communicate with the mobile stations using antenna beams that change in time. The angles of the greatest gain of the beams are adjusted according to signal components arriving from the mobile station. In order to provide detection of good quality without a great deal of calculation, the detection of the desired signal utilizes simultaneously several signals received from different mobile stations taking into account the incoming direction of the signals when selecting the signals.

8 Claims, 3 Drawing Sheets

$I_0 \geq 1,5\, I_{2,MAX}$

OFFSET-COMPENSATED LINEAR RF DETECTOR HAVING A DETECTOR PART AND A LINEARIZER PART

This application is the national phase of international application PCT/FI96/00179 filed Apr. 2, 1996 which designated the U.S.

BACKGROUND OF THE INVENTION

The invention relates to a linear RF detector comprising a detector part having a detector diode biased with bias current, and a linearizer part having an operation amplifier to the inverting input of which is connected both the output of the detector part and the feedback path coming from the output of the operation amplifier.

In a typical embodiment of the detector, the level of a received radio signal is detected, but the detector is also used for detecting the level of a transmitted radio signal. This application relates to the latter kind of detector.

Requirements set for an RF detector include good linearity, high speed and zero output voltage when the input voltage is zero. Accuracy of detection should not suffer if the detector part and the linearizer part are placed on different circuit boards.

A known detector is shown in FIG. 1. It meets all the other requirements except that the output offset voltage is not zero but depends on the differences in temperature of the detector part and the linearizer part. The detector part comprises a detector diode D1, a capacitor C and a resistor $R_0$, and the linearizer part comprises an operation amplifier OA1 having a diode D2 and a resistor R in its feedback path. The signal whose level is to be detected is represented by generator $V_i \cos \omega t$, where $V_i$ is the amplitude to be detected. $V_k$ is a direct-current voltage used for biasing diode D1. Starting from the universal diode current equation $I_D = I_S(T)e^{Vd/Vt}$, where $V_T$ is a voltage proportional to absolute temperature and $I_S(T)$ is a saturation current of the diode, it is possible to show that when diode D1 has a temperature T1, whereby the saturation current is $I_{S1}(T1)$, and diode D2 has a temperature T2, whereby the saturation current is $I_{S2}(T2)$, the output voltage $V_O$ of the detector is represented by formula (1):

$$V_o = -f(V_i; V_{T1}) - V_k - V_{T1} \ln\left(\frac{I_{s1}(T1)}{I_{s2}(T2)}\right) - \frac{T1 - T2}{T2} V_{D2} \qquad (1)$$

The first term of the formula is the desired part depending on the RF input voltage. The second term is a constant offset voltage, and the third term is a varying offset voltage depending on the temperatures and device matching of the diodes. The fourth term, where $V_{D2}$ is a voltage over diode D2, generates both a temperature-dependent offset voltage and an error in that part of the output voltage which depends on amplitude $V_i$. The part of output voltage $V_0$ that is dependent on voltage $V_i$ is given by a non-linear function f, where $I_0$ and $I_1$ are Bessel functions, and is obtained from formula (2)

$$f(V_i; V_T) = \qquad (2)$$

$$V_T \ln\left(I_0\left(\frac{V_i}{V_T}\right)\right) \to \begin{cases} \frac{1}{4} V_T \left(\frac{V_i}{V_T}\right)^2, & V_i < V_T \\ V_i - V_T\left(0.92 + \frac{1}{2}\ln(V_i/V_T)\right), & V_i > V_T \end{cases}$$

$$\frac{df}{dv_i} = \frac{I_1(V_i/V_T)}{I_0(V_i/V_T)} \to \begin{cases} \frac{1}{2}\frac{V_i}{V_T}, & V_i < V_T \\ 1, & V_i > V_T \end{cases}$$

The prior art detector circuit illustrated by FIG. 1 has several advantages. First, according to formula (2) the diode bias current $I_b$ has theoretically, i.e. if the diode functions as an ideal diode, no effect on the part $f(V_i, V_{T1})$ of the output voltage $V_O$ that is dependent on the input voltage. The bias current will have to be set at a large enough value to enable fast charge/discharge of the circuit capacitances. On the other hand, although according to the simplified theory the performance of the circuit is not critical with respect to the bias current of the diode, there are, however, secondary influences, and so the bias current will have to be within a certain range. Second, resistor $R_0$ does not affect the output voltage in the transfer of the input voltage. Third, the detector is fast, if $R_0$ and C are sufficiently small. The fourth advantage is that the linear dynamic range of the detector is about 50 dB. The lowest input level to a 50 Ω impedance is −20 dBm (sensitivity $dV_0/dV_i$ has dropped to half of its nominal value) and the highest input level is +30 dBm, depending on the break down voltage of diode D1 and supply voltage of the operation amplifier.

The main disadvantage of the above-described known detector circuit concerns the output offset voltages, the values of which are predictable only if diodes D1 and D2 are matched devices and have the same temperature, so they should preferably be on the same silicon chip. However, it is often advantageous to place the detector and the linearizing amplifier on different circuit boards. It should also be noted that if diodes D1 and D2 are in the same package, RF energy will easily leak through diode D2 into the linearizing amplifier disturbing its operation. This is difficult to prevent, since D2 is in the feedback path of a fast amplifier, in the vicinity of which no filtering is allowed.

A way of eliminating the offset voltage in a circuit according to FIG. 1 is shown in FIG. 2. In the latter figure, offset compensation is used outside the feedback path of the linearizing amplifier. Diodes D1a and D2a are matched devices and have the same temperature, and they are preferably in the same package. Biasing voltage $V_k$ is obtained by the use of a diode D2 that is similar to diodes D1a and D1b. This makes the bias current independent of the forward voltage and the temperature of the diodes. The offset voltage of matched diodes D1a and D1b at the output of the first operation amplifier OA1 is $2*V_k$. The non-inverting amplification of the latter operation amplifier OA2 is 2 and the inverting amplification is 1, so the final offset at output V is $2*V_k - 1*2V_k = 0$.

The circuit of FIG. 2 has exactly the same drawbacks as the circuit of FIG. 1: the detector and the linearizing amplifier must be placed on the same circuit board, which raises EMC (Electro-Magnetic Compatibility) problems when the RF input level is high (more than 10 dBm). The RF energy leaks through diode D1b into linearizer OA1 and is rectified in the p-n junctions of diode D1b and/or of the operation amplifiers. It is almost impossible to arrange an effective lowpass filter in the vicinity of D1b, because the diode is in the feedback path of a fast amplifier. An extra operation amplifier reduces the speed of the detector and raises the price, especially since the detector must be fast.

SUMMARY OF THE INVENTION

The object of the present invention is to provide a linear detector circuit that does not have the drawbacks involved in the offset voltages of the known detector. The object is thus to provide a detector whose output offset voltages have been eliminated and in which the detector and the linearizing amplifier may have different temperatures and which does not involve RF leakage into the linearizing amplifier.

By the use of a transistor instead of a diode in the feedback path of the linearizing amplifier in accordance with the invention, the output offset voltage is rendered independent of the biasing voltage of the detector diode. The detector part and the linearizer part can thus be made physically separate. In the feedback path, two transistors are connected such that the sum of their base-emitter voltages is essentially the same as the output offset voltage. At the output, one transistor circuit is preferably in a darlington configuration such that it generates an output voltage that compensates for the offset voltage generated by the transistor in the feedback path. When the voltage of the transistor circuit is added to or subtracted from the output voltage of the linearizing amplifier, the result is thus a zero offset voltage.

BRIEF DESCRIPTION OF THE DRAWINGS

In the following, the invention will be described in greater detail by means of a preferred embodiment of the invention with reference to the attached drawings, in which.

DETAILED DESCRIPTION

Figure 1:
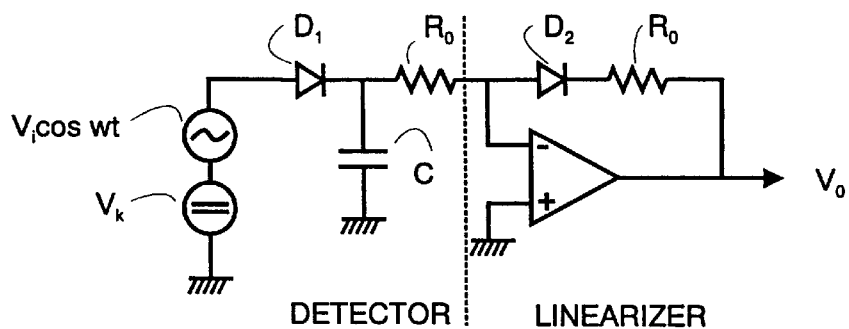
FIG. 1 shows a known linearizing detector.
Figure 2:
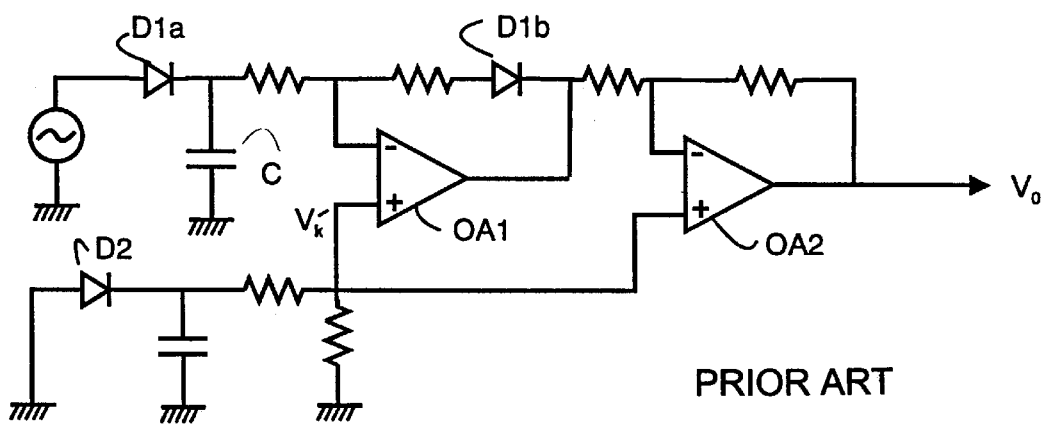
FIG. 2 illustrates a known compensation method.
Figure 3:
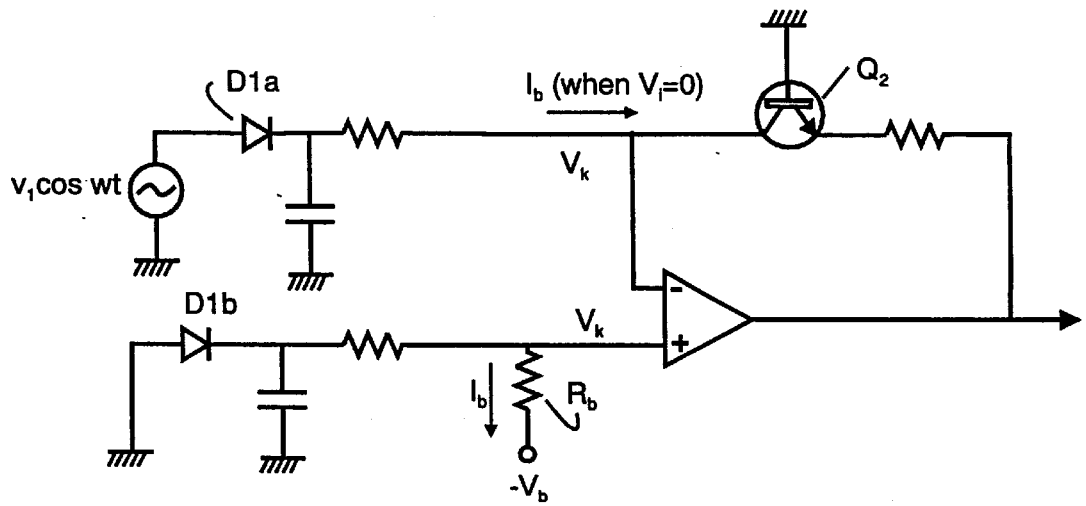
FIG. 3 illustrates a compensation principle according to the invention.

FIG. 3 illustrates the principle of the invention in a simplified form. In practice, the circuit shown must be supplemented with the values stated below. When the linear detector according to the invention as shown in FIG. 3 is compared with the prior art detector shown in FIG. 1, two differences appear: first, biasing voltage source $V_k$ has been transferred to the non-inverting input of the amplifier, so that the RF voltage source can be grounded directly. In addition, diode D1$b$, which is preferably identical to and located on the same silicon chip as detector diode D1$a$ (diode D1 in FIG. 1), is used for transferring voltage $V_k$ such that bias current $I_b$ becomes independent of the device and temperature. A suitable value for the bias current is e.g. 50 $\mu$A. Second, diode D2 of FIG. 1 in the feedback path of the operation amplifier has been replaced with transistor $Q_2$, FIG. 3. The replacement is possible since the collector current vs. base-emitter current of the transistor obeys the same law as the current vs. voltage of the diode. When transistor $Q_2$ is used in the feedback path, the reference level of output voltage $V_0$ is earth (=base voltage of the transistor) instead of direct current $V_k$ that affects at the inputs of the amplifier.

Figure 4:
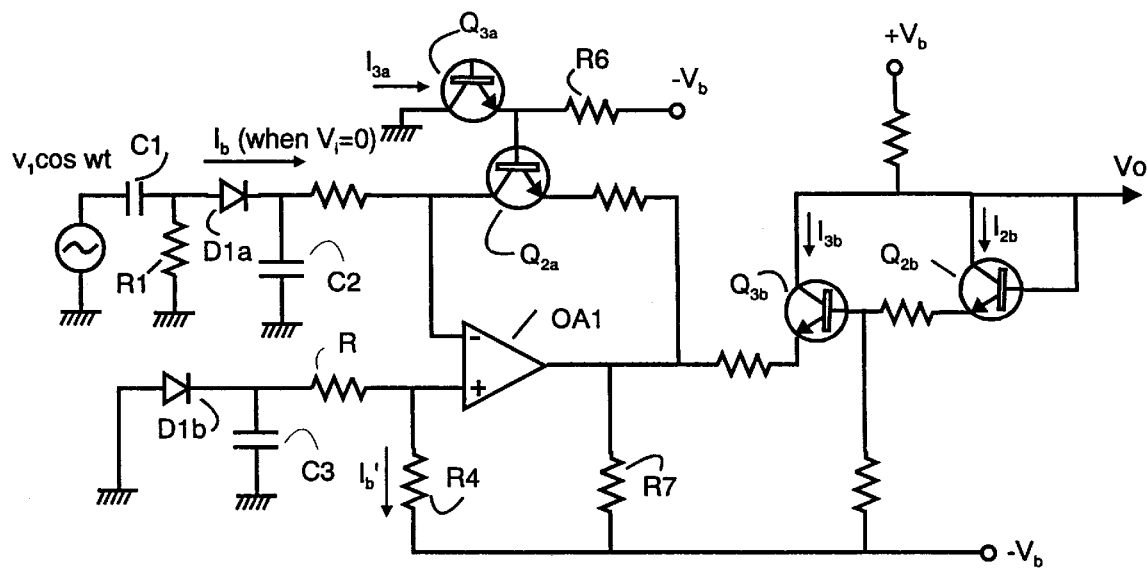
FIG. 4 illustrates compensation of offset voltages.

In reality, the circuit of FIG. 3 does not, however, function in exactly the way described above, for the collector voltage of the transistor is lower than the base voltage by voltage $V_k$. The base voltage must thus be dropped. This is implemented by adding transistor $Q_{3a}$ to the base circuit of transistor $Q_2$ as shown in FIG. 4. The drop in the base voltage is the base-emitter voltage of the added transistor $Q_{3a}$, which is operated with collector current $I_{3a}$. The current is obtained by connecting the emitter of the added transistor $Q_{3a}$ through resistor R6 to negative voltage source $-V_B$. This renders the output offset voltage of operation amplifier OA1 equal to the base-emitter voltages of said transistors, one of the latter voltages corresponding to collector current $I_b$ and the other to collector current $I_{3a}$. Mathematically, this can be expressed by formula (3), in which subindex s represents saturation current:

$$V_{ofs} = V_T \ln\left(\frac{I_{3a}}{I_{s3a}}\right) - V_T \ln\left(\frac{I_b}{I_{s2a}}\right) = V_T \ln\left(\frac{I_{3a} I_b}{I_{s3a} I_{s2a}}\right) \tag{3}$$

The offset voltage is eliminated by raising the output voltage by an equal amount. This is performed by using the base-emitter voltage of darlington transistors $Q_{2b}$, $Q_{3b}$ having collector currents $I_{2b}$ and $I_{3b}$ so that formula (4) holds true:

$$\left(\frac{I_{3a} I_b}{I_{s3a} I_{s2a}}\right) = \left(\frac{I_{3b} I_{2b}}{I_{s3b} I_{s2b}}\right) \tag{4}$$

To realize this, matched transistor pairs $Q_{2a}$ and $Q_{2b}$, and $Q_{3a}$ and $Q_{3b}$, respectively, are used so that $I_{s2a}=I_{s2b}$ and $I_{s2b}=I_{s3b}$. The compensation condition of the output offset voltage of linearizing amplifier OA1 thus becomes:

$$I_{s3a}I_b = I_{s3b}I_{2b}$$

In principle, any combination of $I_{2b}$ and $I_{3b}$ can be used, as long as the product of the currents is the right value. Although the above mentioned transistors do not accurately obey the exponential law, but are still matched pairs, the values $I_{2b}=I_b$ and $I_{3b}=I_{3a}$ compensate for the output offset voltage.

The resistor values of FIG. 4 will not be discussed here. Determining of these values is obvious to a person skilled in the art. Resistors connected to supply voltage sources $-V_B$ and $+V_B$ can be replaced with current sources. Components D1$a$ and R1 can be interchanged without affecting the operation of the circuit, so that a diode pair with a common anode can be used. In that case, however, most of the RF current will flow through capacitor C2, whereby it must be of a low loss type and grounded as directly as possible. Resistor $R_7$, which connects the output of the operation amplifier to supply voltage $-V_B$, is not essential to the operation of the circuit but can be used for reducing dissipation of the operation amplifier.

The circuit of FIG. 4 according to the invention gives a negative output voltage $V_0$. A positive output voltage is obtained by inverting the diodes, replacing the NPN transistors with PNP transistors, and changing the polarities of supply voltages $-V_B$ and $+V_B$.

The above describe circuit will function sufficiently well in most applications, although it has some minor defects. If necessary, most of the defects can be eliminated by adding to circuit complexity. The error caused by the different temperatures of the detector and the linearizer part in that part of the output voltage which is dependent on the input voltage is not eliminated. The error, however, is zero when the input voltage is zero, and at most it is in the order of dozens of millivolts when the input voltage is high.

The diode bias current $I_b$ and currents $I_{3a}$ and $I_{2b}$ are derived from the negative voltage, whereas the compensating current $I_{3b}$ is obtained from the positive voltage. This increases the sensitivity to non-symmetrical supply voltage variations.

The ratio of the collector current of transistor $Q_{2b}$ to diode bias current $I_b$ is not very well defined and is dependent on the temperature due to imperfect matching of diodes $D_{1a}$ and $D_{1b}$, input offset voltage of the operation amplifier, and the temperature and device dependencies of the current gain of transistor $Q_{3b}$. If the resulting output offset voltage is too high, it can be eliminated by tuning, e.g. by making resistor R4 adjustable.

Figure 5:
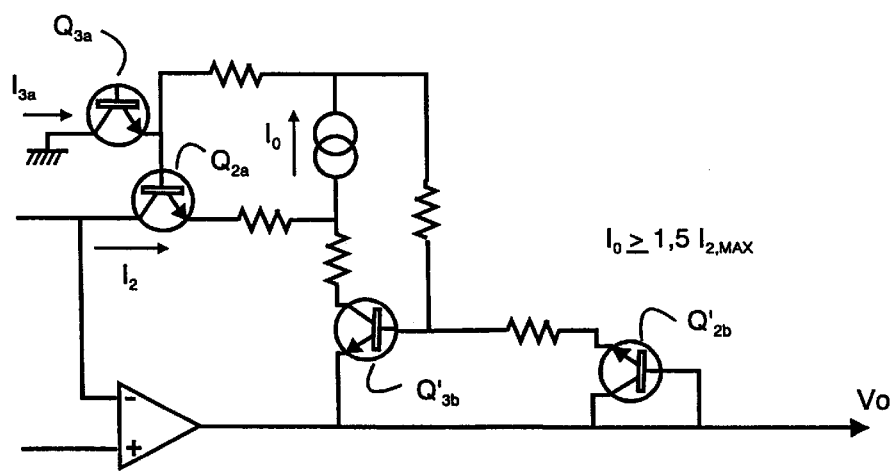
FIG. 5 illustrates compensation of offset voltages in a feedback path.

It is to be understood that the above description and the accompanying figures are intended only to illustrate the present invention. It is obvious to a person skilled in the art that the invention can be varied and modified in many ways without deviating from the scope and spirit of the invention disclosed in the attached claims. Various alternatives are thus possible if the output impedance is to be zero. In the circuit of FIG. 4, the output impedance is not zero. This, however, does not produce an offset error when the load is grounded, but only a small gain error. FIG. 5 shows a preferred embodiment of the invention where the output impedance is zero. In it, the offset compensating part has been transferred to the feedback path of the linearizing amplifier. The drawback is that the circuit has high complexity and that the consumption of current increases.

Figure 6:
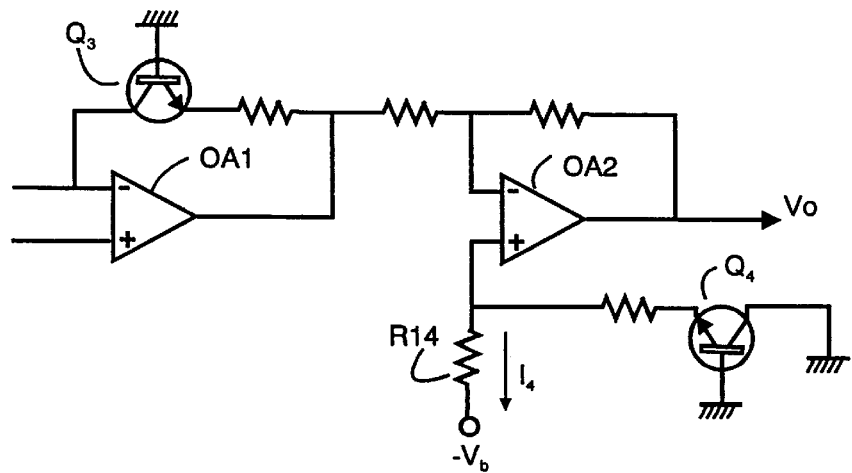
FIG. 6 illustrates compensation of the offset voltage by an operation amplifier and, FIG. 7 illustrates a modification of the compensation of the offset voltage.

FIG. 6 shows another embodiment of the invention where the output impedance is zero. Another operation amplifier OA2 is used therein. This embodiment utilizes a usually undesired characteristic of the simplest possible differential operation amplifier: non-inverting amplification is twice as great as the inverting amplification. Only one transistor $Q_4$ is thus needed to simulate the base-emitter voltage of two transistors.

Figure 7:
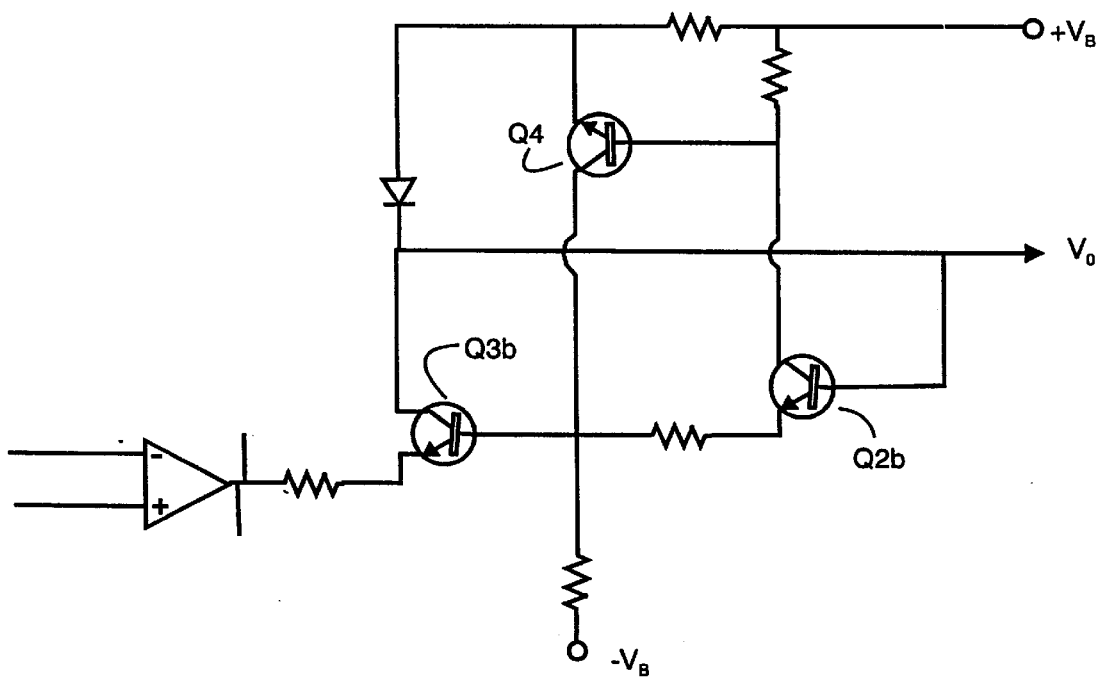

FIG. 7 shows yet another embodiment, in which the defect of the circuit of FIG. 4 is taken into account, i.e. the defect that the circuit does not function correctly if current amplification of transistor $Q_{3b}$ is too small. The base current of transistor $Q_{3b}$ thus forms too large a part of current $I_{2b}$. The problem can be solved by turning transistor $Q_{2b}$ into a 'super emitter follower' by adding one PNP transistor Q4.

I claim:

1. A linear RF detector, comprising:
    a detector part having a detector diode biased with bias current, and a linearizer part having an operation amplifier having an inverting input to which is connected both the output of the detector part and a feedback path coming from the output of the operation amplifier;
    said feedback path comprising a first transistor circuit in which the base of one transistor is grounded, the first transistor circuit being connected such that it generates a first offset voltage at the output of said operation amplifier, said first offset voltage being the sum of each transistor base-emitter voltage of the first transistor circuit;
    the output of said operation amplifier being connected to a second transistor circuit for generating a second offset voltage, said second offset voltage being arranged to cancel said first offset voltage whereby the output offset voltage of said detector is substantially zero.

2. A linear RF detector, comprising:
    a detector part having a detector diode biased with bias current, and a linearizer part having an operation amplifier having an inverting input to which is connected both the output of the detector part and a feedback path coming from the output of the operation amplifier;
    said feedback path comprising a first transistor circuit in which the base of one transistor is grounded, the first transistor circuit being connected such that it generates a first offset voltage at the output of said operation amplifier, said first offset voltage being the sum of each transistor base-emitter voltage of the first transistor circuit;
    the output of said operation amplifier being connected to a second transistor circuit for generating a second offset voltage, said second offset voltage being arranged to cancel said first offset voltage whereby the output offset voltage of said detector is substantially zero;
    wherein said first transistor circuit comprises a first transistor as said one transistor whose base is grounded, and a second transistor whose base is connected to the emitter of the first transistor and whose collector current flows in said feedback path.

3. A linear RF detector, comprising:
    a detector part having a detector diode biased with bias current, and a linearizer part having an operation amplifier having an inverting input to which is connected both the output of the detector part and a feedback path coming from the output of the operation amplifier;
    said feedback path comprising a first transistor circuit in which the base of one transistor is grounded, the first transistor circuit being connected such that it generates a first offset voltage at the output of said operation amplifier, said first offset voltage being the sum of each transistor base-emitter voltage of the first transistor circuit;
    the output of said operation amplifier being connected to a second transistor circuit for generating a second offset voltage, said second offset voltage being arranged to cancel said first offset voltage whereby the output offset voltage of said detector is substantially zero;
    wherein said second transistor circuit comprises a first transistor and a second transistor connected in a darlington configuration from the collector of which the output voltage of said detector is obtained, the emitter of the first transistor of said second transistor circuit being operationally connected to the output of said operation amplifier.

4. An RF detector according to claim 2, wherein:
    said second transistor circuit comprises a first transistor and a second transistor connected in a darlington configuration from the collector of which the output voltage of said detector is obtained, the emitter of the first transistor of said second transistor circuit being operationally connected to the output of said operation amplifier; and
    said first and second transistor circuits are designed such that $$I_{3a}I_b=I_{3b}I_{2b}$$

holds true, $I_{2b}$ and $I_{3b}$ being the collector currents of the transistors in said second transistor circuit, $I_b$ being the bias current of said detector diode, and $I_{3a}$ being the collector current of said first transistor in said first transistor circuit.

5. An RF detector according to claim 1, further comprising:
   a second biasing voltage source connected to a non-inverting input of operation amplifier through a diode that is similar to said detector diode (D1*a*).

6. An RF detector according to claim 1, wherein:
   said second transistor circuit is located in said feedback path.

7. An RF detector according to claim 1, wherein: said second transistor circuit is connected in series with said operation amplifier.

8. An RF detector according to claim 7, wherein:
   said second transistor circuit comprises two transistors which together from a super emitter follower.

* * * * *